United States Patent
Kawai

(10) Patent No.: US 7,286,420 B2
(45) Date of Patent: Oct. 23, 2007

(54) SEMICONDUCTOR MEMORY DEVICE

(75) Inventor: Koichi Kawai, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/488,053

(22) Filed: Jul. 18, 2006

(65) Prior Publication Data

US 2006/0256627 A1    Nov. 16, 2006

Related U.S. Application Data

(63) Continuation of application No. 11/058,185, filed on Feb. 16, 2005, now Pat. No. 7,110,294.

(30) Foreign Application Priority Data

Jul. 20, 2004   (JP) ............................. 2004-211330

(51) Int. Cl.
*G11C 29/00*    (2006.01)
(52) U.S. Cl. .................. 365/200; 365/189.09
(58) Field of Classification Search ................ 365/200, 365/189.09, 240, 185.17
See application file for complete search history.

(56) References Cited

U.S. PATENT DOCUMENTS

| | | | |
|---|---|---|---|
| 5,347,484 A | 9/1994 | Kwong et al. | |
| 6,337,815 B1 * | 1/2002 | Cho | 365/200 |
| 6,459,630 B2 * | 10/2002 | Nakayama et al. | 365/200 |
| 6,552,937 B2 * | 4/2003 | Ladner et al. | 365/200 |
| 6,788,597 B2 | 9/2004 | Ladner et al. | |
| 6,813,184 B2 | 11/2004 | Lee | |
| 6,816,420 B1 | 11/2004 | Liu et al. | |
| 2006/0044918 A1 | 3/2006 | Kang et al. | |

* cited by examiner

*Primary Examiner*—Anh Phung
(74) *Attorney, Agent, or Firm*—Oblon, Spivak, McClelland, Maier & Neustadt, P.C.

(57) ABSTRACT

A semiconductor memory device including: a memory cell array with electrically rewritable and non-volatile memory cells arranged therein; a sense amplifier circuit configured to read data of the memory cell array; first data hold circuits configured to hold data for designating whether each column of the memory cell array is defective or not; and a second data hold circuit configured to hold data read out of the first data hold circuits, and to control skipping a defective column address of the memory cell array in accordance with the data read out of the first data hold circuit.

10 Claims, 13 Drawing Sheets

SEMICONDUCTOR MEMORY DEVICE

CROSS-REFERENCE TO RELATED APPLICATION

This application is a continuation application of application Ser. No. 11/058,185, filed Feb. 16, 2005, now U.S. Pat. No. 7,110,294, issued on Sep. 19, 2006, which is based on and claims the benefit of priority from the prior Japanese Patent Application No. 2004-211330, filed on Jul. 20, 2004, the entire contents of which are incorporated herein by reference.

BACKGROUND OF THE INVENTION

1. Field of the Invention

This invention relates to a semiconductor memory device, especially relates to a column redundancy system for replacing a defective column with a redundant column.

2. Description of Related Art

In a semiconductor memory with a large capacitance, it is usually equipped with a redundancy system for relieving a defective chip. In detail, this type memory has in the chip a defective address storage circuit and an address comparison circuit for comparing an external address with the defective address stored in the defective address circuit. When an external address is input, the address comparison circuit compares it with the defective addresses, and outputs a replace signal when address matching is detected, thereby replacing a defective address cell with a redundant cell array.

A NAND-type flash memory, which is known as one of electrically rewritable and non-volatile memories (EEPROMs), has also such a redundancy system (see, for example, Unexamined Japanese Patent Application Publication No. 2002-100192).

The defective address storage circuit is usually formed of a fuse circuit or a ROM circuit. There has already been provided a method of storing defective address data in a memory cell array together with various initial setup data without the fuse circuit or ROM circuit (see, for example, Unexamined Japanese Patent Application Publication No. 2001-176290).

Especially in the NAND-type flash memory, as the capacitance becomes greater, the column numbers become more. In case the column numbers are increased more, it is required of the memory chip to be increased in the redundant column numbers for securing a constant relief efficiency. Further, in case the redundant column numbers are increased more, the chip occupying area of the defective address circuit and address comparison circuit will be increased more.

In the conventional redundant system, even if the defective addresses are stored in the memory cell array, it is necessary for disposing the address comparison circuit for detecting whether an input address is matched with a defective address or not. Further, in the conventional redundant system, there is a problem that it takes a long access time because it is required of externally supplied address data to be transferred through the address comparison circuit.

SUMMARY OF THE INVENTION

According to an aspect of the present invention, there is provided a semiconductor memory device including:

a memory cell array with electrically rewritable and non-volatile memory cells arranged therein;

a sense amplifier circuit configured to read data of the memory cell array;

first data hold circuits configured to hold data for designating whether each column of the memory cell array is defective or not; and a second data hold circuit configured to hold data read out of the first data hold circuits, and to control skipping a defective column address of the memory cell array in accordance with the data read out of the first data hold circuits.

DETAILED DESCRIPTION OF THE EMBODIMENTS

Illustrative embodiments of this invention will be explained with reference to the accompanying drawings below.

Figure 1:
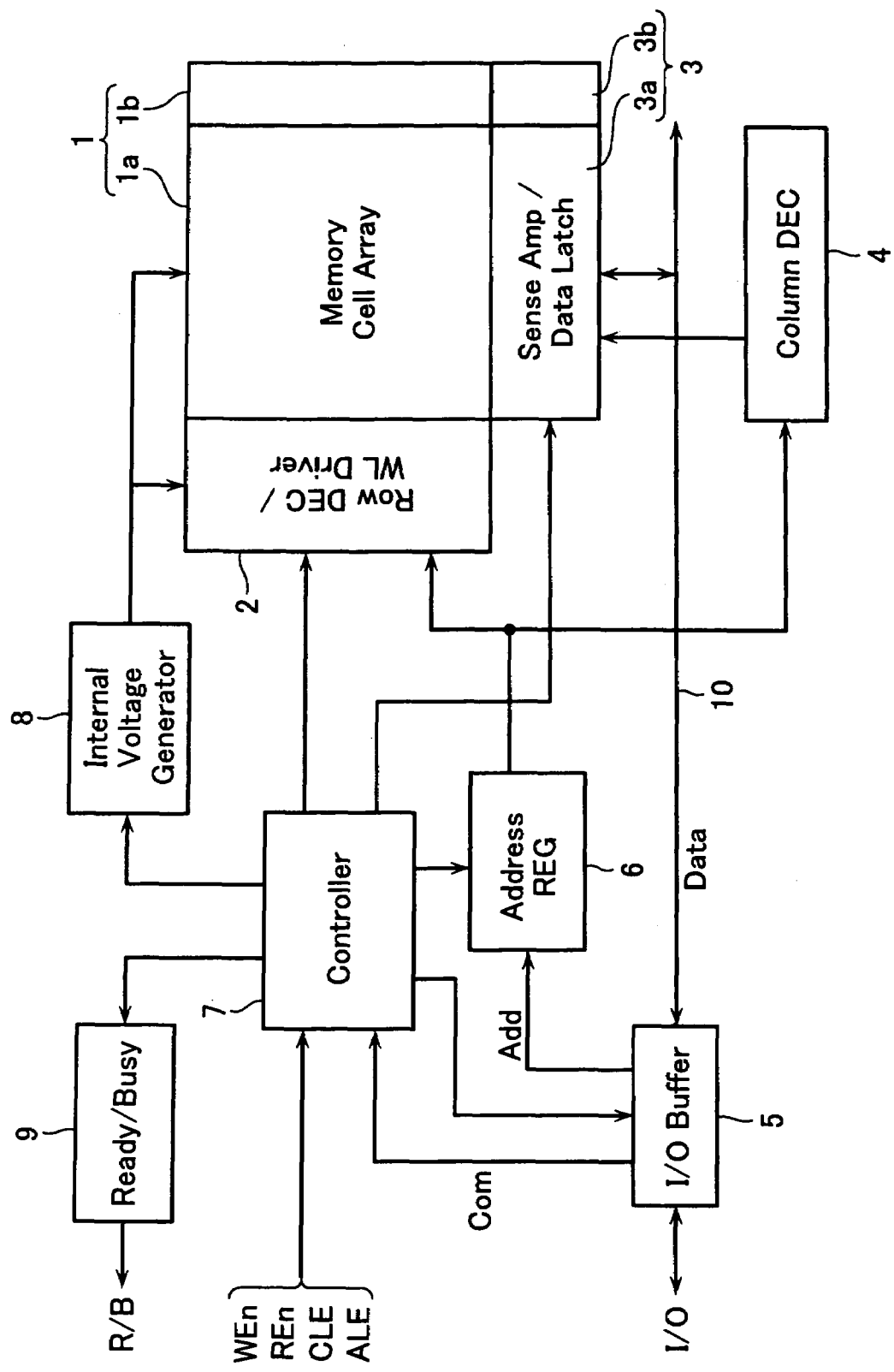
FIG. 1 shows a functional block diagram of a flash memory in accordance with an embodiment of the present invention.
Figure 2:
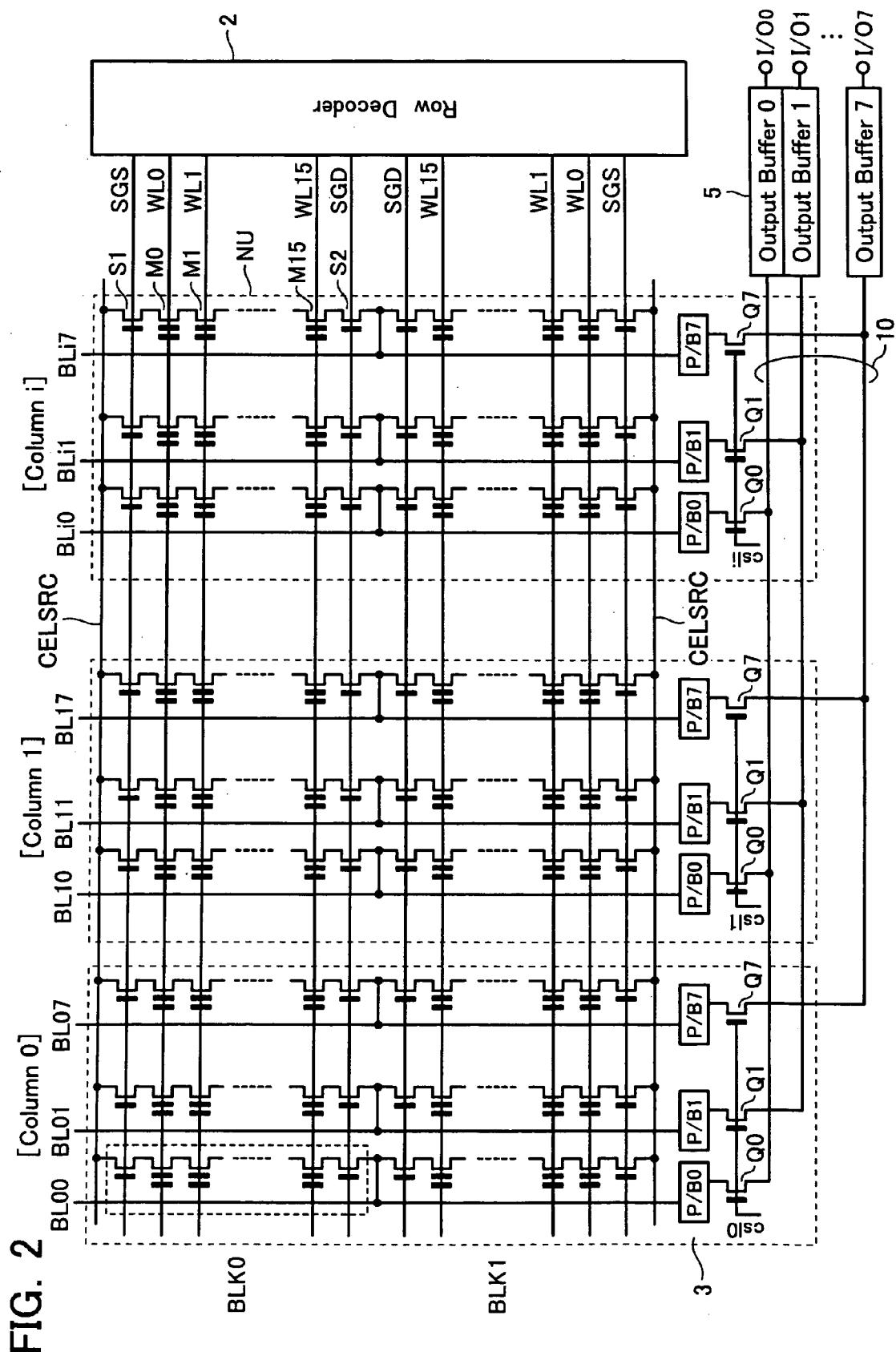
FIG. 2 shows an arrangement of the memory cell array in the flash memory.

FIG. 1 shows a functional block diagram of a NAND-type flash memory in accordance with an embodiment of the present invention, and FIG. 2 shows an arrangement of the memory cell array 1 therein. The memory cell array 1 is formed of NAND cell units NU arranged in a matrix manner. Each NAND cell unit NU has a plurality of electrically rewritable and non-volatile memory cells (i.e., sixteen memory cells in the case shown in FIG. 2) M0-M15, and select gate transistors S1 and S2, which couple the both ends of the memory cell string to a source line CELSRC and a bit line BL, respectively.

Control gates of the memory cells in a NAND cell unit are coupled to different word lines WL0-WL15. Gates of the select gate transistors S1 and S2 are coupled to select gate lines SGS and SGD, respectively.

A set of NAND cell units sharing a word line is defined as a block, which serves as a unit of data erase. As shown in FIG. 2, plural blocks (BLK0, BLK1, ...) are arranged in the direction of the bit line BL.

A row decoder 2, which includes word line drivers and select gate line drivers, is configured to selectively drive word lines and select gate lines in accordance with a row address. A sense amplifier circuit 3 is coupled to the bit lines for performing data read by a page and serves as a data latch for holding write data of a page. That is, data read and write are performed by a page.

The memory cell array 1 has a normal cell array 1a used for normal data read/write and a redundant column cell array 1b used for replacing a defective column with one therein. In correspondence with the cell array, there are prepared a normal sense amplifier circuit 3a and a redundant sense amplifier circuit 3b in the sense amplifier circuit 3.

In FIG. 2, it is shown an example that sense amplifiers P/B are disposed in the sense amplifier circuit 3 to be connected to the bit lines BL with one-to-one correspondence. However, as the memory cell array 1 is more miniaturized in size, it becomes difficult to dispose sense amplifiers at a bit line pitch. To solve this difficulty, it is usually used such a scheme in a large capacitive flash memory that adjacent two bit lines share a sense amplifier. Either one of the adjacent two bit lines is selectively coupled to a sense amplifier.

In the example shown in FIG. 2, a set of memory cells arranged along a word line constitutes a page. In the scheme that adjacent two bit lines share a sense amplifier, a set of memory cells arranged along a word line constitute two pages.

Data transferring between the sense amplifier circuit 3 and external input/output terminals I/O is performed via a data bus 10 and an I/O buffer 5. The sense amplifier circuit 3 has a column gate circuit (with transistors Q0, Q1, . . . , Qi) attached thereto, and a column decoder 4 controls this column gate circuit. Supposing, for example, that eight input/output terminals I/O0-I/O7 are prepared as shown in FIG. 2, data are serially transferred by a byte (i.e., by a column) between the sense amplifier circuit 3 and the terminals I/O based on the above-described column control.

Address "Add" supplied from the I/O terminals is transferred to the row decoder 2 and column decoder 4 via an address register 6. Command "Com" supplied from the I/O terminals is decoded in a controller 7, which controls data write and erase sequences and a data read operation in response to external control signals (i.e., write enable signal WEn, read enable signal REn, command latch enable signal CLE, address latch enable signal ALE, and the like) and the command Com.

An internal voltage generation circuit 8 generates various internal voltages necessary in the write, erase and read modes under the control of the controller 7. To generate voltages higher than the power supply voltage, boost circuits are used in the internal voltage generation circuit 8. A status register 9 is to output a status signal R/B designating whether the chip is in a ready state or a busy state about data write or read.

Figure 3:
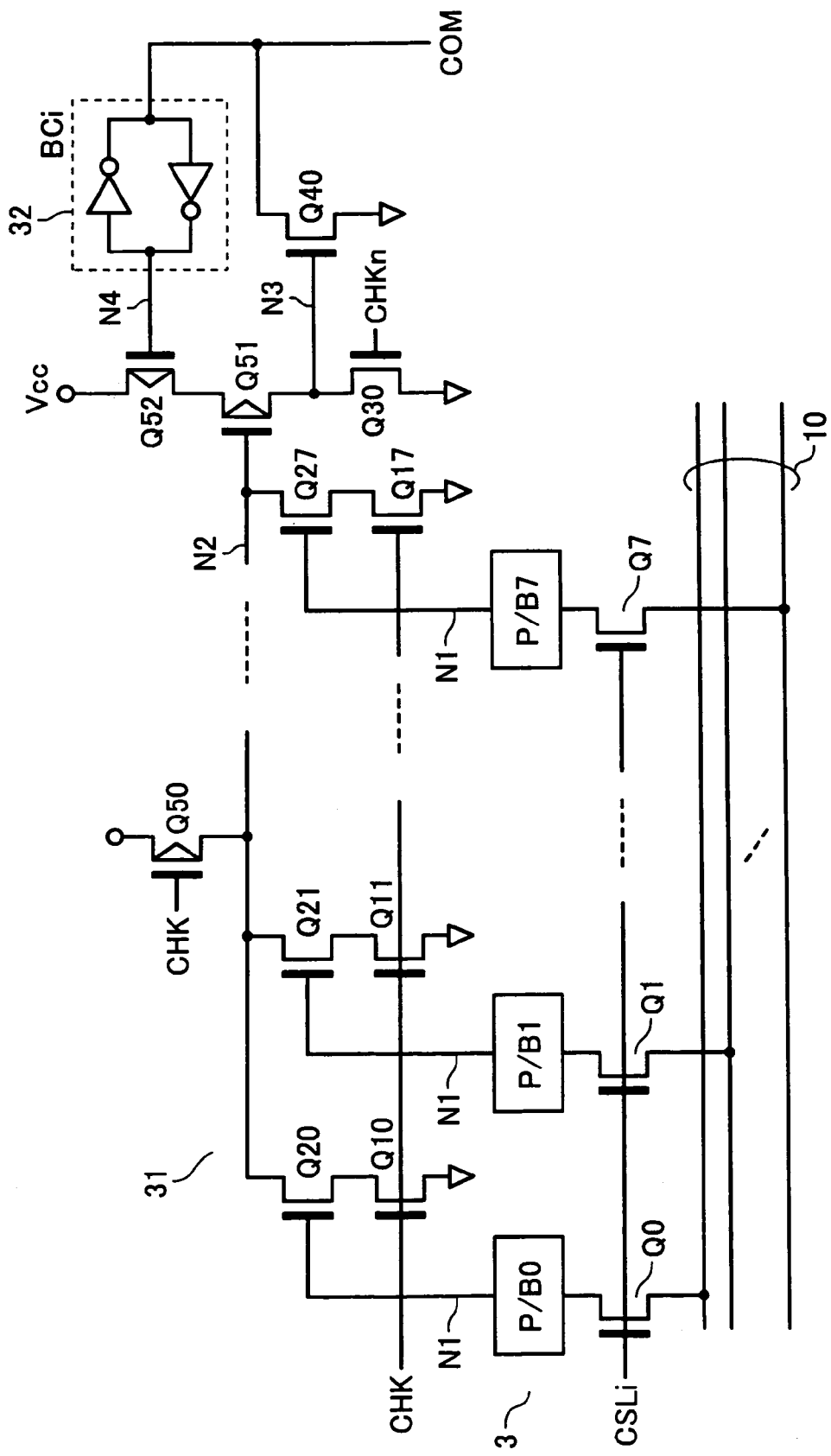
FIG. 3 shows a defective column isolation data hold circuit disposed for each column of the flash memory.

FIG. 3 shows a circuit portion of defective column isolation-use data hold circuit 32 attached to the sense amplifier circuit 3 with respect to one column. The data hold circuit 32 is coupled to a verify judgment circuit 31, which is prepared for each column to be attached to the sense amplifier circuit 3. The verify judgment circuit 31 serves for detecting whether the sense amplifier circuit 3 has become to show an all "1" data state (i.e., write completion) or not as a result of each verify-read operation in data write and erase modes.

For example, in a data write mode, control voltages of the bit lines are determined in accordance with the loaded write data, "0" or "1" (where, "1" data designates write-inhibiting), in the sense amplifier circuit 3, and the entire memory cells within a selected page are written simultaneously. In a write-verify operation, write data in the sense amplifier circuit are controlled in such a manner that when "0" write has been verified, "0" data in the corresponding sense amplifier is inverted to "1" (write inhibiting) hereinafter. Therefore, when 1-page data write has been completed, the entire data in the sense amplifier circuit 3 become "1". The verify judgment circuit 31 is prepared to detect such the data state.

The verify-judgment circuit 31 has NMOS transistors Q20, Q21, . . . , Q27 constituting a NOR gate, which detects whether the entire nodes N1 in the sense amplifier circuit 3 are in a "L" level state or not. Sources of the NMOS transistors Q20, Q21, . . . , Q27 are connected to a ground potential via NMOS transistors Q10, Q11, . . . , Q17, respectively, gates of which are controlled by a check signal CHK. Drains of the NMOS transistors Q20, Q21, . . . , Q27 are connected to a common node N2. The common node N2 is precharged at a "H" level via a PMOS transistor Q50, which is on in a stationary state.

The node N2 is connected to the gate of a PMOS transistor Q51, source and drain of which are connected to the power supply terminal Vcc via a current source PMOS transistor Q52 and the ground potential via a NMOS transistor Q30, respectively. The gate of NMOS transistor Q30 is controlled by a check signal CHKn. Connected to the connection node N3 between transistors Q51 and Q30 is the gate of NMOS transistor Q40, drain of which is connected to a judgment-use signal line COM. This signal line COM is precharged at a "H" level in a stationary state.

Data node N4 of the defective column isolation data hold circuit 32 is connected to the gate of PMOS transistor Q52. The data hold circuit 32 stores such a defective column isolation data that node N4 is in a "H" state in case this column is defective, whereas node N4 is in an "l" state in case this column is normal. That is, the defective column isolation data serves for letting a defective column to be unrelated with verify-judgment.

The verify judgment circuit 31 judges the verify-read state in response to the check signal CHK="H". That is, in case the sense amplifier nodes N1 in a column are not in an all "L" (i.e., data "1") state, the node N2 is discharged to turn on the PMOS transistor Q51, thereby turning on the NMOS transistor Q40, and causing the signal line COM to be lowered in potential. In contrast to this, in case the entire sense amplifier nodes N1 are "L", the signal line COM is not reduced in level. Therefore, monitor the signal line COM, and write (or erase) completion may be confirmed.

The data hold circuit 32 is prepared to disable the verify judgment circuit 31 with respect to a defective column. That is, in a defective column, the current source PMOS transistor Q52 is set to be off at all times based on the node N4="H", the verify judgment always results in "Pass". In other words, it is set a state based on the data hold circuit 32 that defective columns are ignored with respect to the verify judgment.

Since the above-described defective column isolation data hold circuit 32 designates whether the column is defective or not, it serves as a kind of defective address storage circuit. In this embodiment, this data hold circuit 32 will be used for column redundancy without using other defective address storage circuit and address comparison circuit.

Note here that the defective column isolation data (i.e., defective address data) to be held in the data hold circuit 32 is, for example, previously programmed in an initial setup data storage area in the memory cell array. The defective column isolation data stored in the memory cell array will be automatically read out at a power-on reset time so as to be transferred to and stored in the data hold circuit 32.

Figure 4:
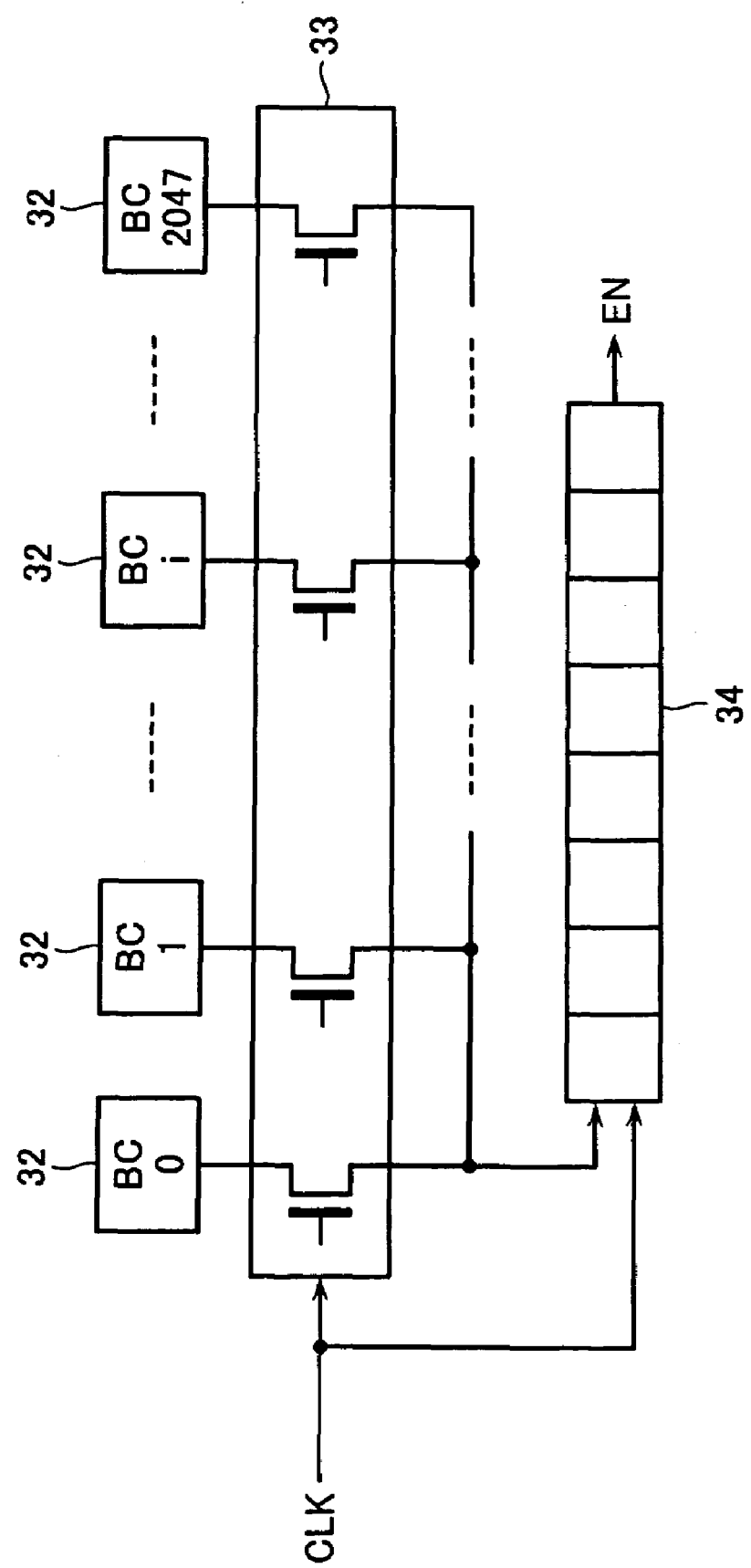
FIG. 4 shows the dada hold circuit and a shift register to which data in the data hold circuit are read out.

As shown in FIG. 4, the defective column isolation data in the data hold circuits 32 are transferred to a shift resister 34 serving another data hold circuit via a transfer circuit 33. In detail, prior to column selection in data read or write mode, defective column isolation data of eight columns from the head column are sequentially read out from the data hold circuits 32, and serially input into the shift register 34 in accordance with a clock signal CLK, which is output from the controller 7 in response to an external control signal. Although the shift register 34 is formed of eight stages in correspondence with the redundant column numbers "8" in this example, it is not limited to this bit numbers.

The output of the final stage of the shift register 34 serves as an enable signal "EN" for skipping a defective column address. When the defective column isolation data for eight columns from the head column are sequentially read out from the data hold circuits 32, the enable signal EN, which is defined as the output of the final stage of the shift register 34, becomes "0" or "1" in accordance with the head column address being non-defective or defective.

While the clock signals CLK are successively output in accordance with column address increment, the defective column address data in the data hold circuits 32 are sequentially read out and input to the shift register 34, whereby the enable signals EN are output column by column.

An operation of defective column replacement in a data read mode will be described in detail bellow.

Figure 5:
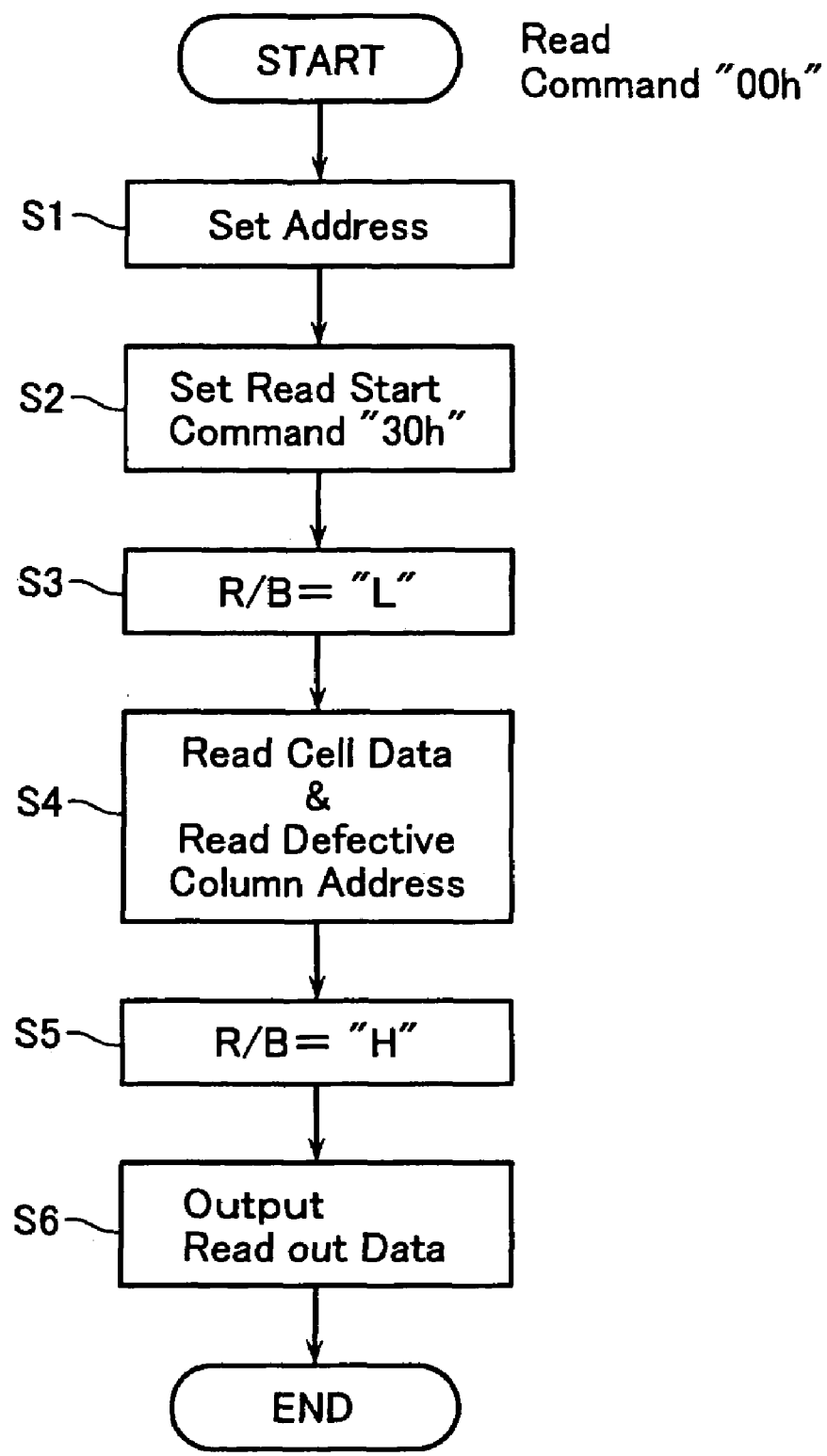
FIG. 5 shows an algorism of data read control of the flash memory.
Figure 6:
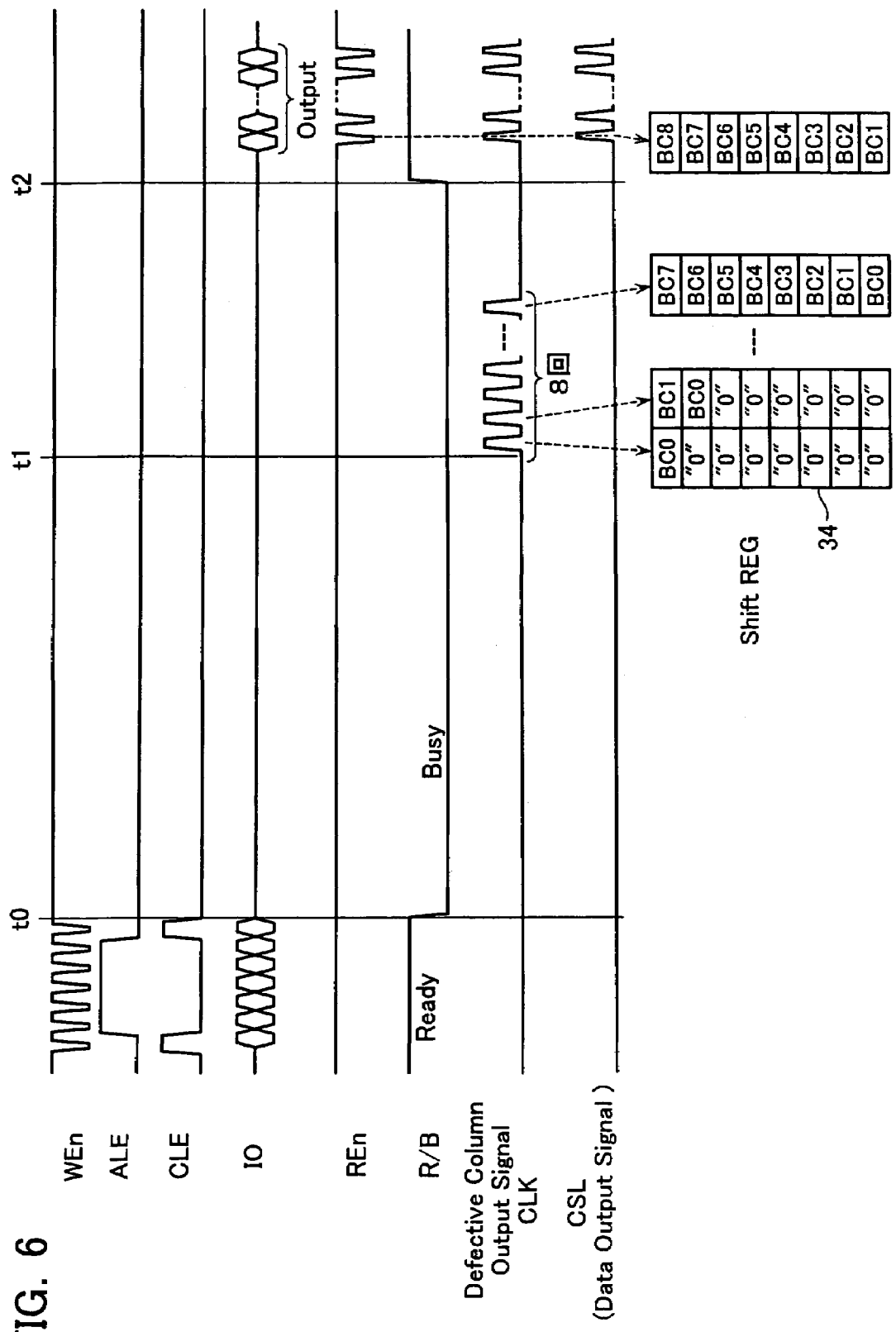
FIG. 6 shows a timing chart of the data read operation of the flash memory.

FIG. 5 shows an algorism of a data read operation, and FIG. 6 shows a timing chart thereof. When a read command (e.g., "00h") is input simultaneously with a command latch enable signal CLE, the controller 7 starts the read control. When a read address (including a block address and a page address in the block) is input as following an address latch enable signal ALE input, it is transferred to and stored in the address register 6 under the control of the controller 7 (at step S1).

Following it a read start command (e.g., "30h") is input simultaneously with a command latch enable signal CLE, and set in the controller 7 (at step S2). In response to this, the status register 9 is set in a state as outputting R/B="L" (busy state) (at step S3), and then a read operation is performed about a selected page (at step S4).

As shown in FIG. 6, while the busy signal R/B="L" is output from timing t0, cell data of the selected page in the memory cell array are read out to the sense amplifier circuit 3. In the period of the data read operation, the controller 7 outputs defective column outputting clock CLK from timing t1, whereby defective column isolation data (i.e., defective column address data) of eight columns are read out from the head column from the data hold circuits 32. FIG. 6 shows state changes of the shift register 34 while the defective column isolation data in the data hold circuits (BC0, BC1, . . . ) 32 are transferred to the shift register 34 as synchronous with the clock CLK. In the case of FIG. 6, "0" designates that the column is normal, whereas "1" designates that the column is defective.

Note here it is also possible to transfer the 8-bit column isolation data in parallel in response to one clock CLK from the data hold circuits 32 to the shift register 34 prior to the data output operation.

When having ended the operation of reading data of the memory cell array to the sense amplifier circuit 3, a status signal, R/B="H" (Ready), is output (at timing t2, and at step S5). Following it a data output operation will be performed for serially outputting the read data in the sense amplifier circuit 3 by a byte (at step S6).

Figure 7:
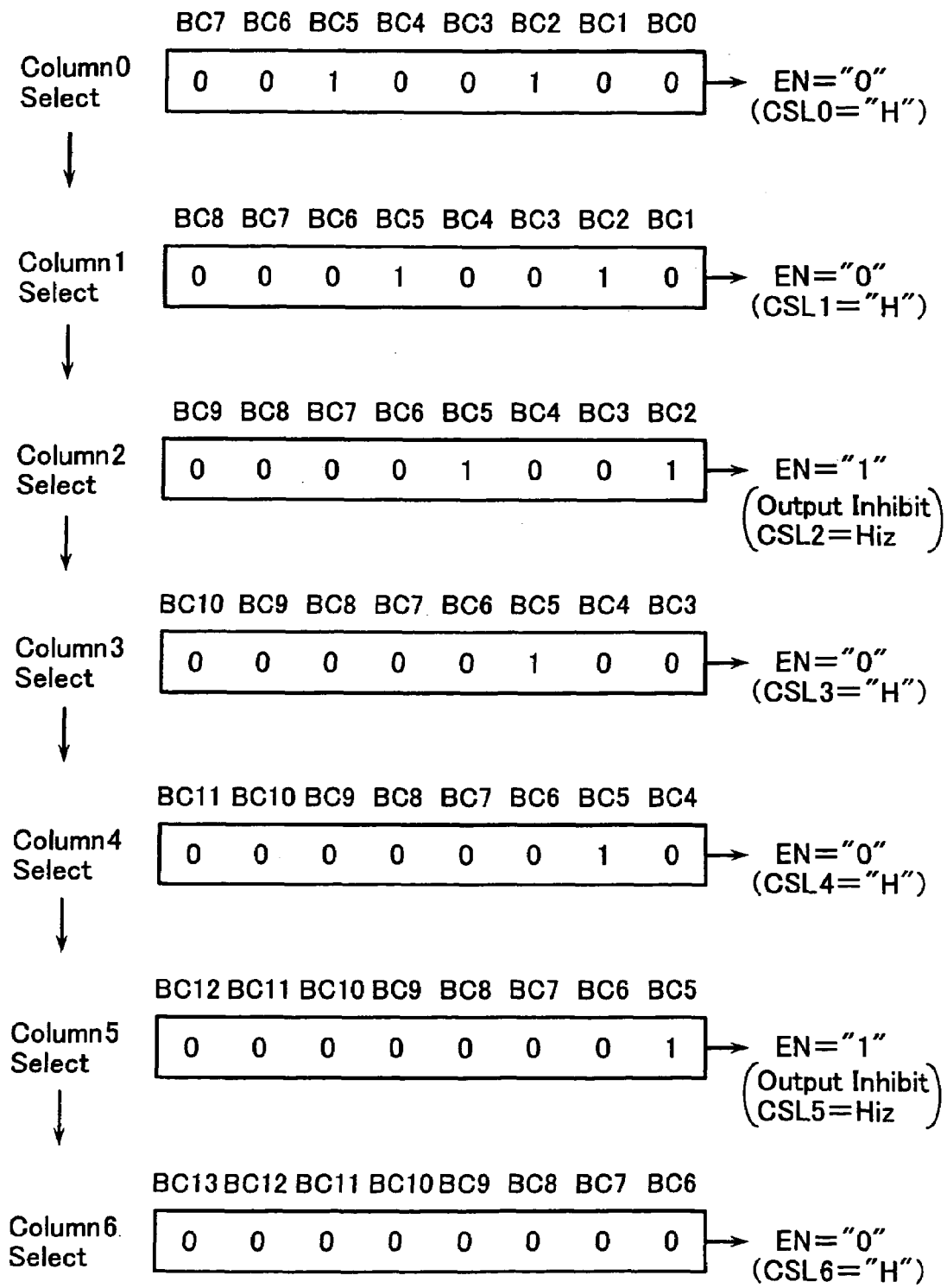
FIG. 7 shows data state changes of the shift register due to column address increment in the data read mode.

The data output operation of the read data is, as shown in FIG. 7, preformed with a column address increment in a counter in the address register 6 as synchronous with the read enable signal REn. Further, the clocks CLK are output as synchronous with the column address increment for sequentially outputting the defective column isolation data, and they are serially input into the shift register 34. The defective column skipping operation will be performed based on the final stage output of the shift register 34 as described bellow.

FIG. 7 shows state changes of the 8-bit shift register 34, and defective column skip operations controlled by the shift register 34 in the data output mode. "Column0 Select" shown in FIG. 7 is an initial state at the beginning of the read data output operation (timing t2), and the column isolation data of 8 columns from the head column address, which are stored in the data hold circuits BC0-BC7, are stored in the shift register 34. In the example shown in FIG. 7, it is shown that the third column (BC2) and sixth column (BC5) are defective (i.e., data "1").

As described above, the final stage output of the shift register 34 is used as the enable signal EN for activating the column decoder 4. In the initial state where Comumn0 is selected as shown in FIG. 7, the enable signal EN is "0". With this enable signal EN, the column decoder 4 is activated to output a column select signal CSL0="H", which selects the head column address. That is, the first column of the read data is selected to be output by the column select signal CSL0.

When Column1 is selected, the data stored in the shift register 34 are shifted bit by bit, and a next defective column isolation data of the data hold circuit (BC8) corresponding to the Column9 is input to the shift register 34. In this state, the final stage output is "0" (i.e., EN="0"), whereby second column select signal CSL1="H" is output in response to it.

Next, when Column2 is selected, the final stage output (i.e., the enable signal EN) becomes "1", and it disables the column decoder (i.e., output-inhibiting state). That is, since Column2 is defective, the column select signal CSL2 is not output, and the corresponding read data are not output.

Hereinafter, similar operations will be repeated. FIG. 7 shows the column select states from Column0 to Column6. As described above, the data output operation is controlled in accordance with the column address increment as synchronous with the read enable signal REn in such a manner that only the read data of normal columns are output, whereas a defective column(s) is skipped.

Figure 8:
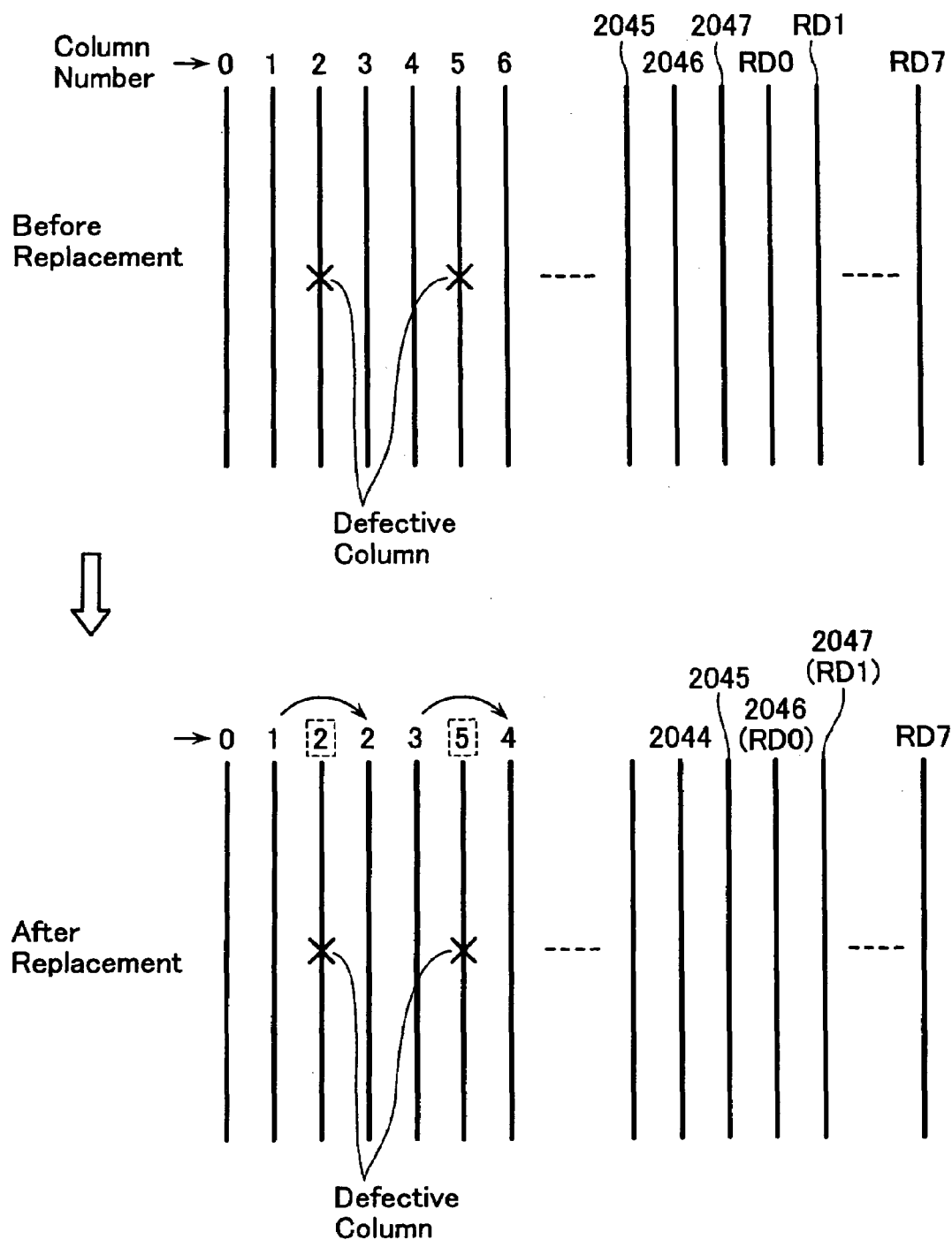
FIG. 8 shows states of the defective column replacement in the flash memory.
Figure 9:
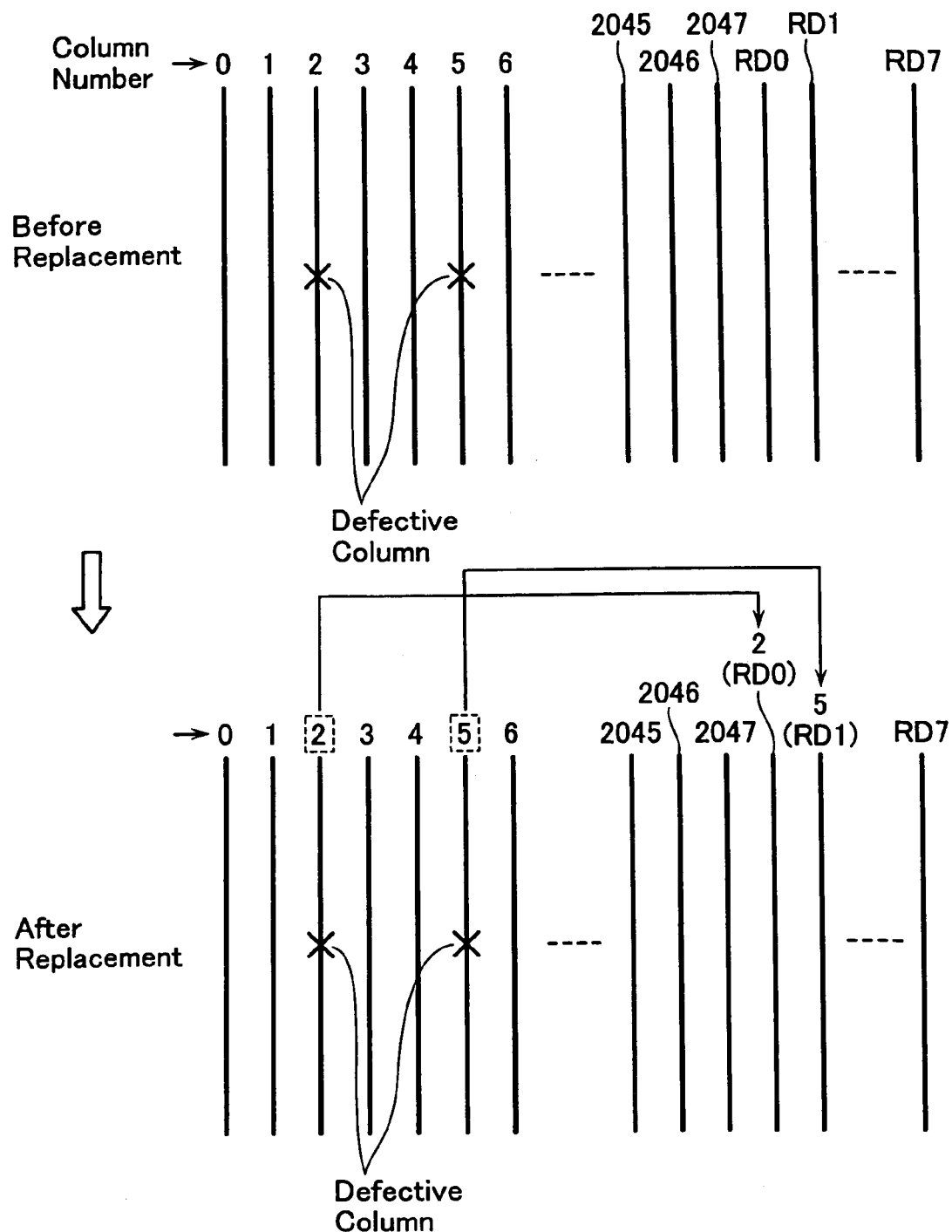
FIG. 9 shows states of the defective column replacement in the conventional case in comparison with FIG. 8.

FIG. 8 shows a state of the column replacement in accordance with this embodiment. To compare with this, FIG. 9 shows a state of the column replacement in a conventional case. In these cases, it is supposed that the number of columns is 2048 (i.e., column select is done by column address CA0-CA10 with eleven bits), and Column2 and Column5 are defective. Eight redundant columns, RD0-RD7, are prepared.

In the conventional case as shown in FIG. 9, when the defective columns, Column2 and Column5, are selected, these are replaced with the redundant columns RD0 and RD1, respectively. In contrast to this, in this embodiment as shown in FIG. 8, when the defective columns, Column2 and Column5 are selected, these are skipped, and it is resulted in that the redundant columns RD0 and RD1 are selected as columns "Column2046" and "Column2047", respectively.

To perform such defective column skipping as in the above-described embodiment, it is required of the chip to have a column address counter with twelve bits, thereby being possible to sequentially select 2048 columns and 8 redundant columns, RD0-RD7, in accordance with the internal column address increment. Further, it is necessary that the column address with twelve bits is assigned to the 2048 columns and 8 redundant columns so as to select one of 2056 columns. In addition, it is required of the read enable signal REn to be toggled such that the toggle numbers reach the sum of the above-described column numbers and redundant column numbers.

In a data write mode, a defective column skip operation will be performed, as well as in the read data output operation, in the data loading operation for loading one page write data in the sense amplifier circuit 3.

Figure 10:
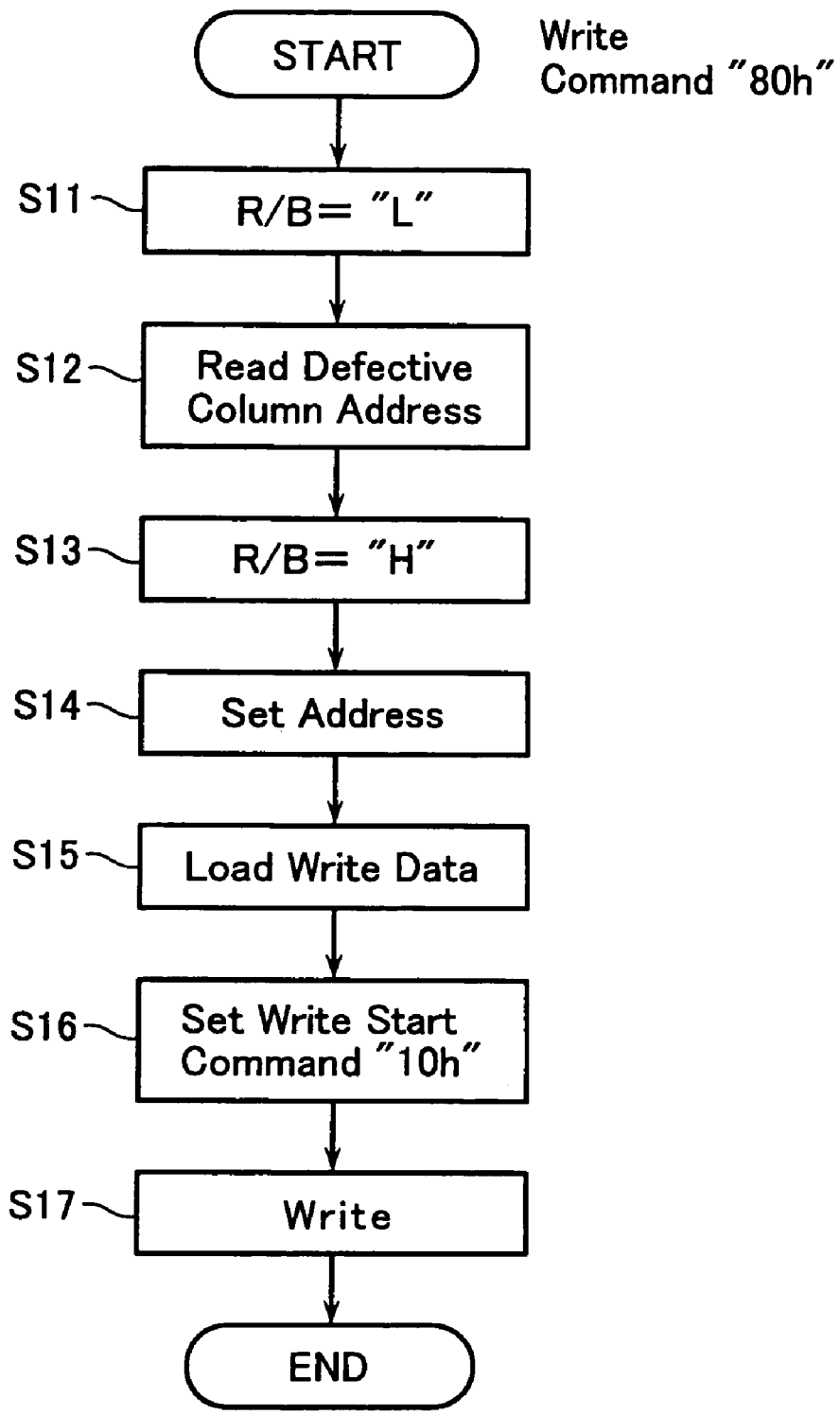
FIG. 10 shows an algorism of data write control of the flash memory.

FIG. 10 shows a control algorism of data write. Input and set a write command (e.g., "80h") in the controller 7, and the write sequence control is started. Initially, the status register 9 is set to output R/B="L" (Busy) (at step S11), following it the defective column isolation data in the data hold circuits 32 are read out and input to the shift register 34 in accordance with the read clock CLK as well as in the data read mode as described with reference to FIG. 6 (at step S12). These defective column address data are used for skipping the defective column address in the write data loading operation as similar to the above-described data read operation.

Next, the status signal, R/B, becomes "H" (at step S13). In response to it, write address is input and set in the address register 6 (at step S14). Following it one page write data are loaded in the sense amplifier circuit 3 (at step S15).

The above-described data load is performed with column address increment as well as the read data output operation such that the write data are serially transferred by a byte and loaded in the sense amplifier circuit 3. According to this data load operation, the defective column isolation data in the data hold circuits 32 are read out into the shift register 34 as synchronous with the column address increment as similar to the data output operation, and a defective column skipping operation will be performed in accordance with whether the final stage output of the shift register 34 is "0" or "1".

After having loaded the write data, a write start command (e.g., "10h") is input and set in the controller (at step S16), then the write data in the sense amplifier circuit is written into a selected page in the memory cell array (at step S17). The data write is performed by repeat of write voltage application and write-verify.

According to this embodiment, it becomes possible to control the defective column replacement without a defective address storage circuit and an address comparison circuit, thereby being possible to reducing the chip area of the NAND-type flash memory. Further, since there is no delay of the address data transferring due to the address comparison circuit, it becomes possible to access the flash memory with a high rate.

As an embodiment, an electric card using the non-volatile semiconductor memory devices according to the above-described embodiment of the present invention and an electric device using the card will be described bellow.

Figure 11:
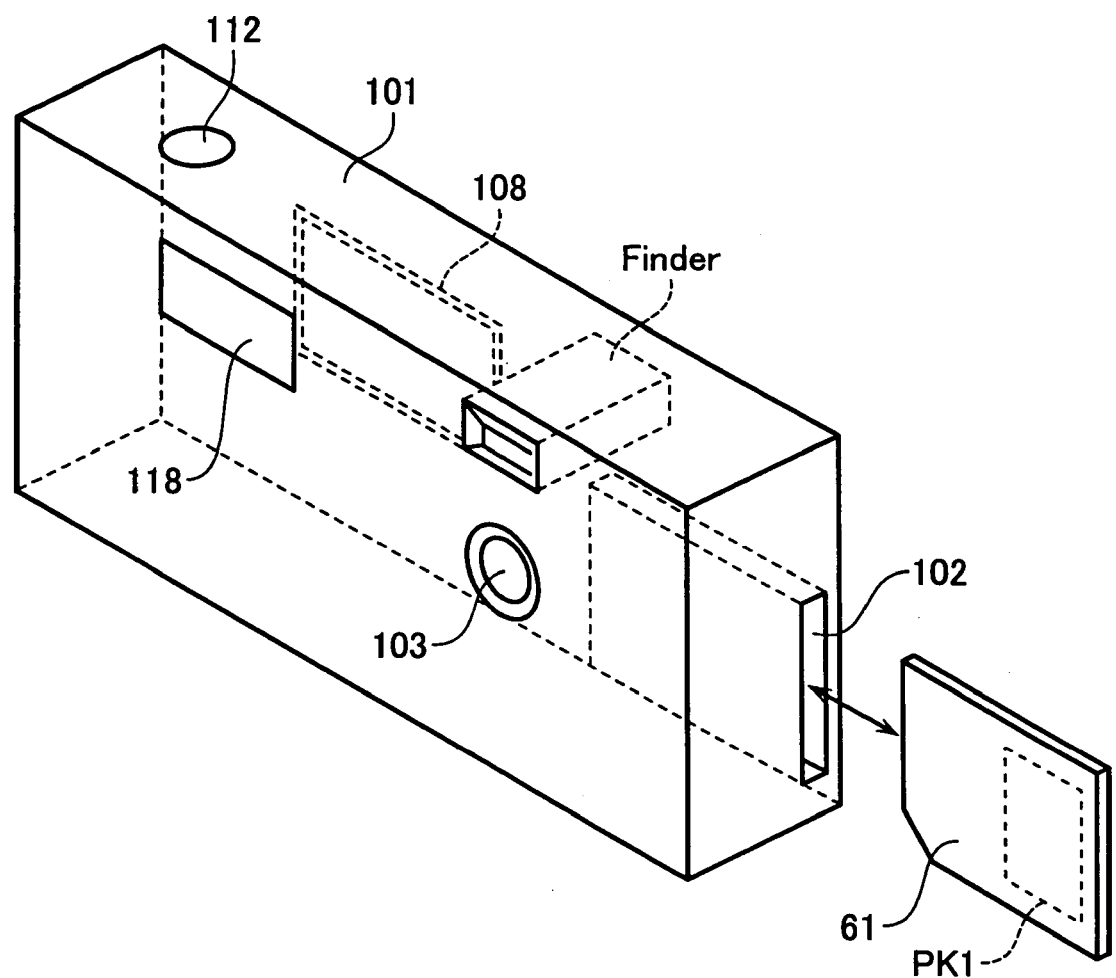
FIG. 11 shows another embodiment applied to a digital still camera.

FIG. 11 shows an electric card according to this embodiment and an arrangement of an electric device using this card. This electric device is a digital still camera 101 as an example of portable electric devices. The electric card is a memory card 61 used as a recording medium of the digital still camera 101. The memory card 61 incorporates an IC package PK1 in which the non-volatile semiconductor memory device or the memory system according to the above-described embodiments is integrated or encapsulated.

The case of the digital still camera 101 accommodates a card slot 102 and a circuit board (not shown) connected to this card slot 102. The memory card 61 is detachably inserted in the card slot 102 of the digital still camera 101. When inserted in the slot 102, the memory card 61 is electrically connected to electric circuits of the circuit board.

If this electric card is a non-contact type IC card, it is electrically connected to the electric circuits on the circuit board by radio signals when inserted in or approached to the card slot 102.

Figure 12:
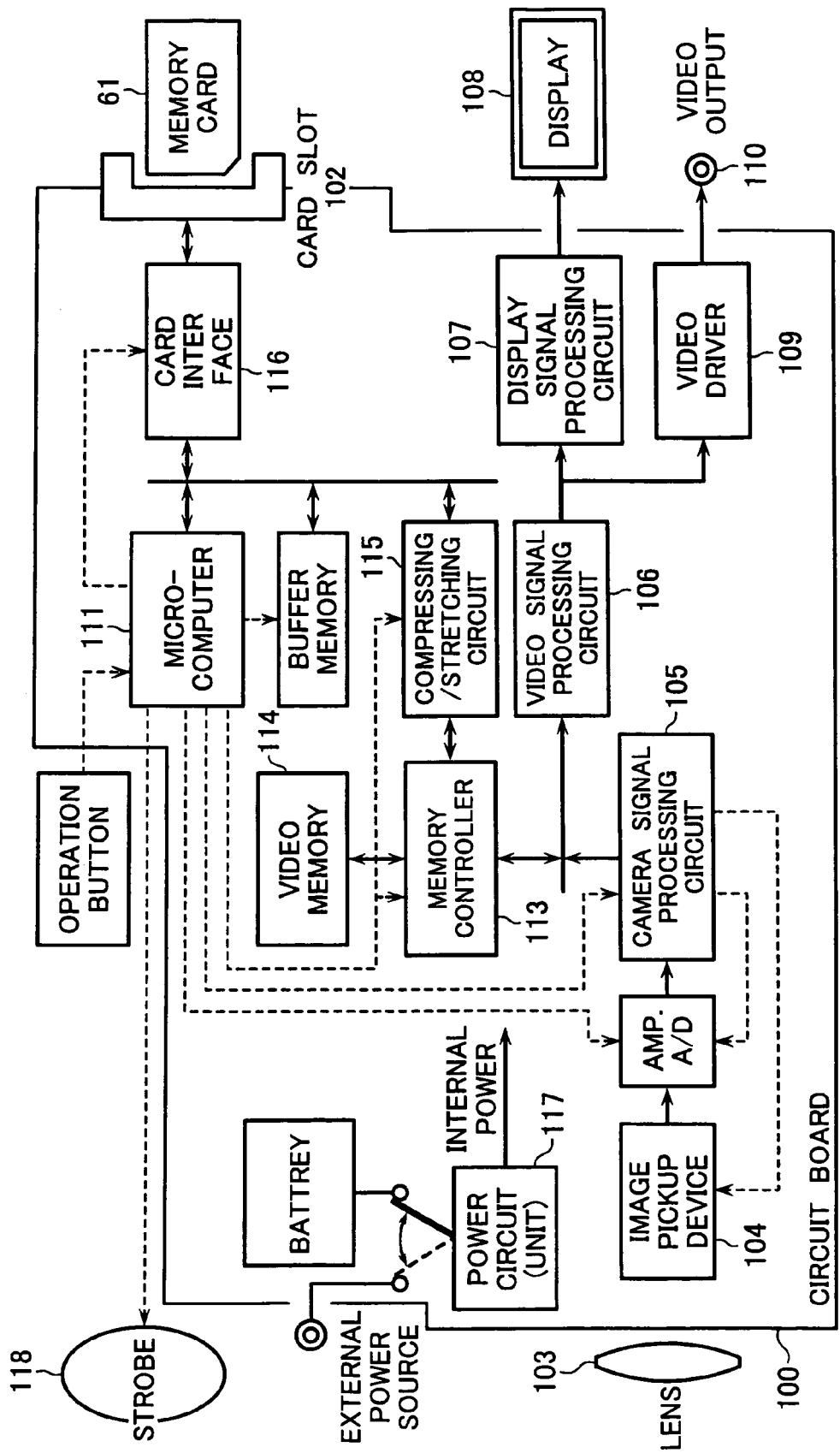
FIG. 12 shows the internal configuration of the digital still camera.
Figure 13A:
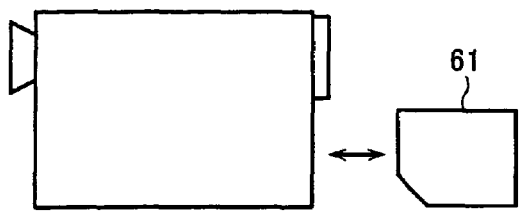
FIGS. 13A to 13J show other electric devices to which the embodiment is applied.
Figure 13B:
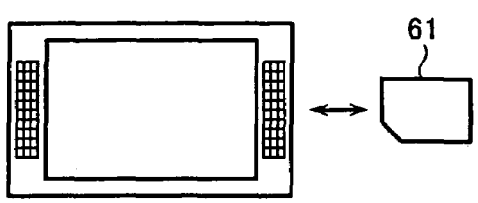
Figure 13C:
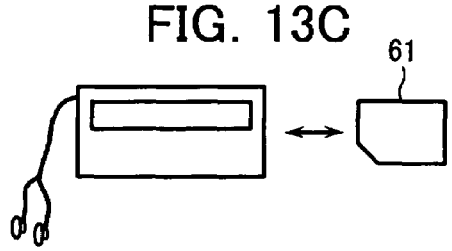
Figure 13D:
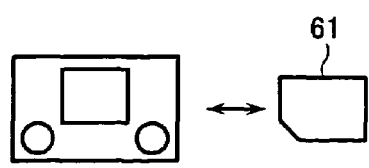
Figure 13E:
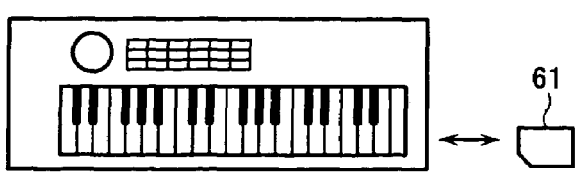
Figure 13F:
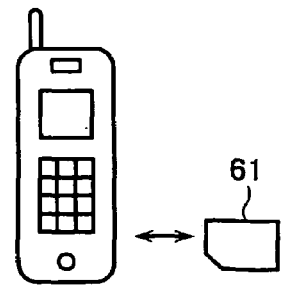
Figure 13G:
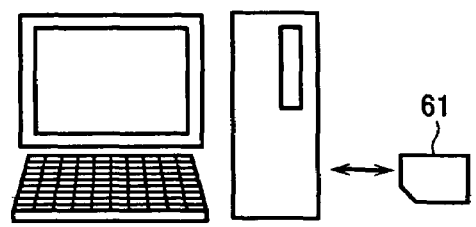
Figure 13H:
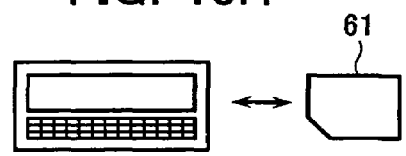
Figure 13I:
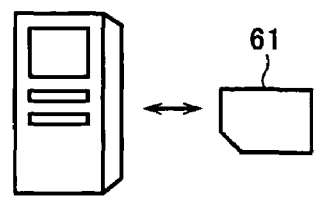
Figure 13J:
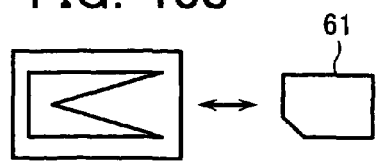

FIG. 12 shows a basic arrangement of the digital still camera. Light from an object is converged by a lens 103 and input to an image pickup device 104. The image pickup device 104 is, for example, a CMOS sensor and photoelectrically converts the input light to output, for example, an analog signal. This analog signal is amplified by an analog amplifier (AMP), and converted into a digital signal by an A/D converter (A/D). The converted signal is input to a camera signal processing circuit 105 where the signal is subjected to automatic exposure control (AE), automatic white balance control (AWB), color separation, and the like, and converted into a luminance signal and color difference signals.

To monitor the image, the output signal from the camera processing circuit 105 is input to a video signal processing circuit 106 and converted into a video signal. The system of the video signal is, e.g., NTSC (National Television System Committee). The video signal is input to a display 108 attached to the digital still camera 101 via a display signal processing circuit 107. The display 108 is, e.g., a liquid crystal monitor.

The video signal is supplied to a video output terminal 110 via a video driver 109. An image picked up by the digital still camera 101 can be output to an image apparatus such as a television set via the video output terminal 110. This allows the pickup image to be displayed on an image apparatus other than the display 108. A microcomputer 111 controls the image pickup device 104, analog amplifier (AMP), A/D converter (A/D), and camera signal processing circuit 105.

To capture an image, an operator presses an operation button such as a shutter button 112. In response to this, the microcomputer 111 controls a memory controller 113 to write the output signal from the camera signal processing circuit 105 into a video memory 114 as a flame image. The flame image written in the video memory 114 is compressed on the basis of a predetermined compression format by a compressing/stretching circuit 115. The compressed image is recorded, via a card interface 116, on the memory card 61 inserted in the card slot.

To reproduce a recorded image, an image recorded on the memory card 61 is read out via the card interface 116, stretched by the compressing/stretching circuit 115, and written into the video memory 114. The written image is input to the video signal processing circuit 106 and displayed on the display 108 or another image apparatus in the same manner as when image is monitored.

In this arrangement, mounted on the circuit board 100 are the card slot 102, image pickup device 104, analog amplifier (AMP), A/D converter (A/D), camera signal processing circuit 105, video signal processing circuit 106, display signal processing circuit 107, video driver 109, microcomputer 111, memory controller 113, video memory 114, compressing/stretching circuit 115, and card interface 116.

The card slot 102 need not be mounted on the circuit board 100, and can also be connected to the circuit board 100 by a connector cable or the like.

A power circuit 117 is also mounted on the circuit board 100. The power circuit 117 receives power from an external power source or battery and generates an internal power source voltage used inside the digital still camera 101. For example, a DC-DC converter can be used as the power circuit 117. The internal power source voltage is supplied to the respective circuits described above, and to a strobe 118 and the display 108.

As described above, the electric card according to this embodiment can be used in portable electric devices such as the digital still camera explained above. However, the electric card can also be used in various apparatus such as shown in FIGS. 13A to 13J, as well as in portable electric devices. That is, the electric card can also be used in a video camera shown in FIG. 13A, a television set shown in FIG. 13B, an audio apparatus shown in FIG. 13C, a game apparatus shown in FIG. 13D, an electric musical instrument shown in FIG. 13E, a cell phone shown in FIG. 13F, a personal computer shown in FIG. 13G, a personal digital assistant (PDA) shown in FIG. 13H, a voice recorder shown in FIG. 13I, and a PC card shown in FIG. 13J.

This invention is not limited to the above-described embodiment. For example, while it has been explained a NAND-type flash memory, it should be appreciated that the present invention may be adapted to other types flash memories such as NOR-type, AND-type, DINOR-type and the like ones. Further, it will be understood by those skilled in the art that various changes in form and detail may be made without departing from the spirit, scope, and teaching of the invention.

What is claimed is:

1. An access method of a semiconductor memory device, the device including a memory cell array and a data hold circuit configured to hold data for designating whether each column of the memory cell array is defective or not, comprising:
   reading out the data stored in the data hold circuit in a read mode or a write mode; and
   skipping a defective column address of the memory cell array in accordance with the data read out of the data hold circuit.

2. The access method according to claim 1, wherein
   the device has a verify-judgment circuit for judging a result of write-verify, and the data hold circuit is attached to the verify-judgment circuit to store column isolation data for disabling the verify-judgment circuit at a defective column address, and wherein
   the column isolation data stored in the data hold circuit are read out in response to an external control signal used for incrementing internal column address and serially input to a shift register, the output of which serves for skipping the defective column address.

3. The access method according to claim 2, wherein
   the column isolation data stored in the data hold circuit are read out and serially input to the shift register prior to column selection with a column decoder, and the shift register outputs an enable signal serving for determining whether the column decoder is to be activated or not.

4. The access method according to claim 2, wherein
   the column isolation data are previously programmed in the memory cell array and automatically read out to be stored in the data hold circuit at a power-on reset time.

5. The access method according to claim 1, wherein
   the memory cell array comprises NAND cell units arranged therein, each NAND cell unit including a plurality of electrically rewritable and non-volatile memory cells connected in series.

6. An access method of a semiconductor memory device, the device including a memory cell array; a verify-judgment circuit for judging a result of write-verify; and a data hold circuit attached to the verify-judgment circuit for storing column isolation data for disabling the verify-judgment circuit at a defective column address, comprising:
   inputting an external control signal to read out the column isolation data stored in the data hold circuit in a read mode or a write mode; and
   skipping the defective column address of the memory cell array in accordance with the column isolation data read out of the data hold circuit.

7. The access method according to claim 6, wherein
   the external control signal is for incrementing internal column address, and
   the column isolation data stored in the data hold circuit are read out and serially input to a shift register in accordance with the external control signal, the output of the shift register serving for skipping the defective column address.

8. The access method according to claim 7, wherein
   the column isolation data are serially input to the shift register prior to column selection with a column decoder, and the shift register outputs an enable signal serving for determining whether the column decoder is to be activated or not.

9. The access method according to claim 7, wherein
   the column isolation data are previously programmed in the memory cell array and automatically read out to be stored in the data hold circuit at a power-on reset time.

10. The access method according to claim 6, wherein
    the memory cell array comprises NAND cell units arranged therein, each NAND cell unit including a plurality of electrically rewritable and non-volatile memory cells connected in series.

* * * * *